United States Patent
Yang et al.

(10) Patent No.: US 10,134,772 B2
(45) Date of Patent: Nov. 20, 2018

(54) ARRAY SUBSTRATE, DISPLAY PANEL AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Ming Yang, Beijing (CN); Lei Ma, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/513,293

(22) PCT Filed: Apr. 14, 2016

(86) PCT No.: PCT/CN2016/079256
§ 371 (c)(1),
(2) Date: Mar. 22, 2017

(87) PCT Pub. No.: WO2016/188257
PCT Pub. Date: Dec. 1, 2016

(65) Prior Publication Data
US 2017/0301696 A1    Oct. 19, 2017

(30) Foreign Application Priority Data
May 22, 2015 (CN) .......................... 2015 1 0268478

(51) Int. Cl.
*H01L 27/12* (2006.01)
*H01L 27/32* (2006.01)
*G09G 3/20* (2006.01)

(52) U.S. Cl.
CPC ............. *H01L 27/124* (2013.01); *G09G 3/20* (2013.01); *H01L 27/32* (2013.01); *G09G 2300/0452* (2013.01)

(58) Field of Classification Search
CPC .................................................... H01L 27/124
See application file for complete search history.

(56) References Cited

U.S. PATENT DOCUMENTS

2010/0110114 A1    5/2010  Hashimoto
2013/0321251 A1   12/2013  Kang et al.
(Continued)

FOREIGN PATENT DOCUMENTS

CN          2819256 Y      9/2006
CN        202837748 U      3/2013
(Continued)

OTHER PUBLICATIONS

Machine Translation of CN104483794.*
(Continued)

*Primary Examiner* — Julia Slutsker
(74) *Attorney, Agent, or Firm* — Nath Goldberg & Meyer; Joshua B. Goldberg (57) ABSTRACT

The present disclosure provides an array substrate, a display panel and a display apparatus. The array substrate includes gate lines and data lines defining a sub-pixel array, which contains sub-pixels of three different colors and includes repeating units, each of which includes twelve sub-pixels arranged in a matrix of four rows and three columns; in each repeating unit, three sub-pixels in a same row or column, among nine sub-pixels in three consecutive rows, have colors different from each other, three sub-pixels in the other row than the three consecutive rows of the repeating unit are arranged in the same order as three sub-pixels in a middle row among the three consecutive rows; each gate line is (Continued)

connected to a corresponding row of sub-pixels in the sub-pixel array; and each data line is connected to sub-pixels of a same color in corresponding three consecutive columns of sub-pixels in the sub-pixel array.

19 Claims, 5 Drawing Sheets

(56) References Cited

U.S. PATENT DOCUMENTS

| | | |
|---|---|---|
| 2014/0028945 A1 | 1/2014 | Wang |
| 2016/0233234 A1* | 8/2016 | Yang ............... G02F 1/136286 |
| 2016/0370919 A1 | 12/2016 | Xu et al. |
| 2017/0110042 A1 | 4/2017 | Liao |

FOREIGN PATENT DOCUMENTS

| | | |
|---|---|---|
| CN | 104155823 A | 11/2014 |
| CN | 104483794 A | 4/2015 |
| CN | 104536632 A | 4/2015 |
| CN | 104570531 A | 4/2015 |
| CN | 104992957 A | 10/2015 |
| JP | 2010-102189 A | 5/2010 |

OTHER PUBLICATIONS

International Search Report dated Jul. 22, 2016 issued in corresponding Intentional Patent Application No. PCT/CN2016/079256 along with English translation of the International Search Report and the Written Opinion of the International Searching Authority.
Office Action dated Jun. 26, 2016 issued in corresponding Chinese Application No. 201510268478.7.

* cited by examiner

ARRAY SUBSTRATE, DISPLAY PANEL AND DISPLAY APPARATUS

This is a National Phase Application filed under 35 U.S.C. 371 as a national stage of PCT/CN2016/079256, filed Apr. 14, 2016, an application claiming the benefit of Chinese Application No. 201510268478.7, filed May 22, 2015, the content of each of which is hereby incorporated by reference in its entirety.

TECHNICAL FIELD

The present invention relates to the field of display technology, and particularly relates to an array substrate, a display panel and a display apparatus.

BACKGROUND

In recent years, market share of high-resolution large-screen smartphones has been increasing. In one aspect, as the resolution of a smartphone product increases, pixel size thereof becomes finer and finer, and process difficulty in fabricating a display panel increases accordingly; a virtual display product with reduced the number of data lines in a display achieves, by virtue of additional algorithm or signal processing, a display effect close to that of a product whose true resolution is the same as the virtual display product, thereby significantly alleviating the process difficulty in fabricating a display panel. In another aspect, while large-size screens bring viewing comfort, the development thereof is gradually restricted by short standby time of phones; in addition to gradually upgrading battery capacity, seeking for a solution for reducing power consumption has become an important development direction of smartphones.

At present, manufactures generally reduce power consumption of a display apparatus by optimizing the driving mode thereof. For example, an overall power consumption of the display apparatus can be effectively lowered by adopting column inversion driving mode. However, when the display apparatus driven in column inversion mode needs to display an image of pure color (one of pure red (R), pure green (G) and pure blue (B)), the power consumption of the display apparatus is still large since data lines all need to be driven by using pulse waveforms.

SUMMARY

Embodiments of the present invention provide an array substrate, a display panel including the array substrate and a display apparatus including the display panel, which can effectively reduce power consumption in display of an image of pure color.

In order to achieve the above object, embodiments of the present invention provide an array substrate, comprising: a plurality of gate lines and a plurality of data lines, the plurality of gate lines and the plurality of data lines defining a sub-pixel array, wherein, the sub-pixel array contains sub-pixels of three different colors, the sub-pixel array comprises a plurality of repeating units, each of which comprises twelve sub-pixels arranged in a matrix of four rows and three columns;

in each repeating unit, three sub-pixels in a same row or a same column, among nine sub-pixels in three consecutive rows, have colors different from each other;

three sub-pixels in the other row than the three consecutive rows of the repeating unit are arranged in the same order as three sub-pixels in a middle row among the three consecutive rows;

each gate line is connected to a corresponding row of sub-pixels in the sub-pixel array; and each data line is connected to sub-pixels of a same color in corresponding three consecutive columns of sub-pixels in the sub-pixel array.

Optionally, each data line goes across a middle column of sub-pixels in the corresponding three consecutive columns of sub-pixels.

Optionally, two sub-pixels which are connected to a same data line and adjacent in a column direction are also adjacent in a row direction.

Optionally, the data lines on the array substrate are all arranged parallel to each other.

Optionally, the sub-pixels are in the shape of a rectangle.

Optionally, the sub-pixels have a width-length ratio ranging from 1:3~1:1.

Further optionally, the sub-pixels have a width-length ratio of 1:2 or 1:1.5.

Optionally, the sub-pixels of three different colors are red sub-pixels, green sub-pixels and blue sub-pixels, respectively.

Optionally, the sub-pixel array is a subpixel array used for virtual display.

In order to achieve the above object, embodiments of the present invention further provide a display panel comprising an array substrate, and the array substrate is the above-described array substrate.

In order to achieve the above object, embodiments of the present invention further provide a display apparatus comprising a display panel, and the display panel is the above-described display panel.

The present invention has the beneficial effects as follows:

embodiments of the present invention provide an array substrate, a display panel including the array substrate and a display apparatus including the display panel, wherein each data line on the array substrate is connected to sub-pixels of a same color, so signals on all of the data lines are DC (direct current) signals when displaying an image of pure color, as a result, power consumption required for display is significantly lowered, and in display of a mixed-color image of a certain gray-scale, charging time of the sub-pixels is increased, and normal display of sub-pixels is ensured.

DETAILED DESCRIPTION

To enable those skilled in the art to better understand technical solutions of the present invention, an array substrate, a display panel and a display apparatus provided in the present invention will be further described in detail below in conjunction with the accompanying drawings.

Embodiments of the present invention provide an array substrate, which includes a plurality of gate lines and a plurality of data lines, the plurality of gate lines and the plurality of data lines define a sub-pixel array, and the sub-pixel array includes therein sub-pixels of three different colors. The sub-pixel array includes a plurality of repeating units, each of which includes twelve sub-pixels arranged in a matrix of four rows and three columns. In each repeating unit, three sub-pixels in a same row or a same column, among nine sub-pixels in three consecutive rows, have colors different from each other, and three sub-pixels in the other row (i.e., the row except the three consecutive rows among the four rows) are arranged in the same order as three sub-pixels in a middle row among the three consecutive rows. Each gate line on the array substrate is connected to a corresponding row of sub-pixels in the sub-pixel array, and each data line is connected to sub-pixels of a same color in corresponding three consecutive columns of sub-pixels in the sub-pixel array.

It should be noted that, description will be given below by taking an example where sub-pixels of three different colors are red sub-pixels, green sub-pixels and blue sub-pixels, respectively, and as is known by a person skilled in the art, it is not intended to limit the technical solutions of the present application.

Figure 1:
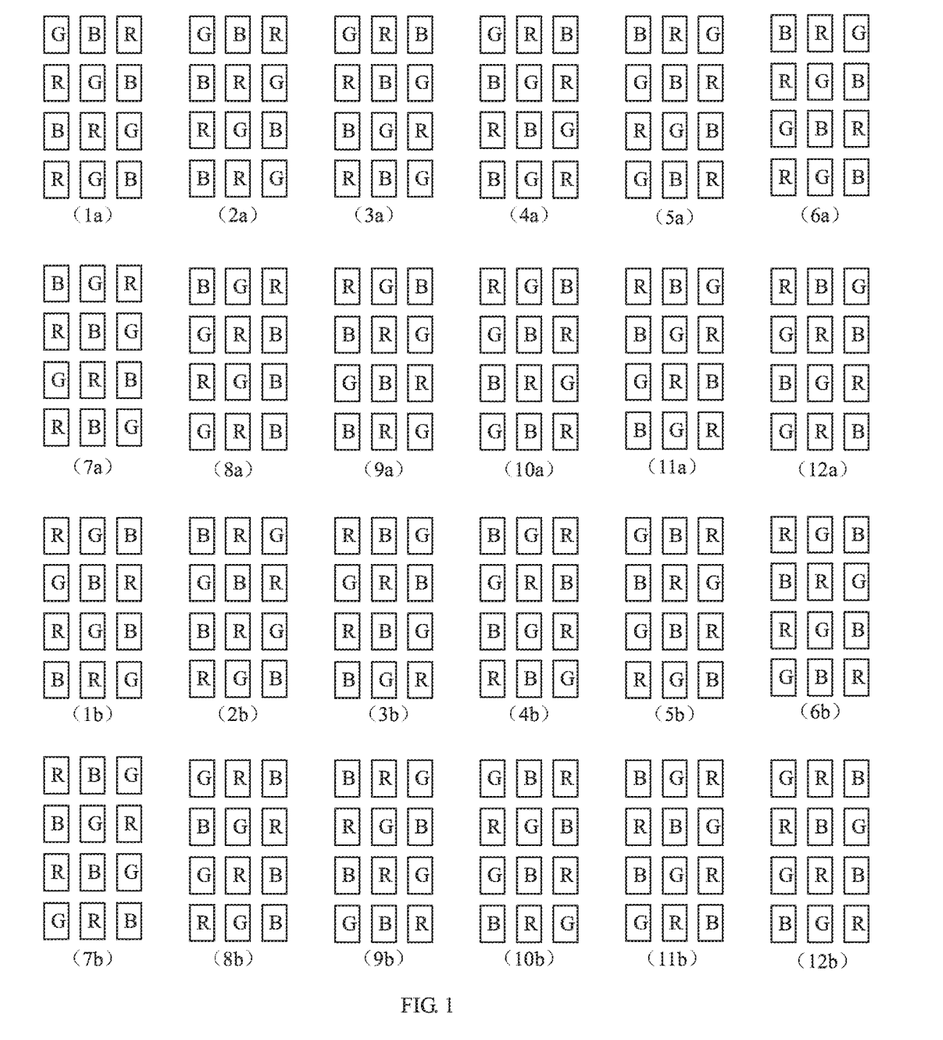
FIG. 1 is a schematic diagram illustrating arrangements of repeating units according to embodiments of the present invention.

FIG. 1 is a schematic diagram illustrating arrangements of repeating units according to embodiments of the present invention. As shown in FIG. 1, when nine sub-pixels in the three consecutive rows in the repeating unit are nine sub-pixels in the first, second and third rows of the repeating unit, three sub-pixels in the fourth row of the repeating unit are arranged in the same order as three sub-pixels in the second row of the repeating unit, and in this case, the repeating unit may be arranged as shown in any one of (1a) to (12a) of FIG. 1. When nine sub-pixels in the three consecutive rows in the repeating unit are nine sub-pixels in the second, third and fourth rows of the repeating unit, three sub-pixels in the first row of the repeating unit are arranged in the same order as three sub-pixels in the third row of the repeating unit, and in this case, the repeating unit may be arranged as shown in any one of (1b) to (12b) of FIG. 1.

Figure 2:
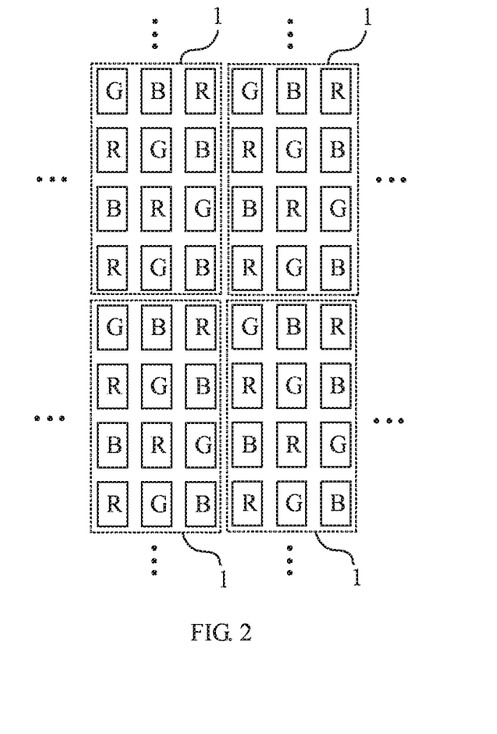
FIG. 2 is a schematic diagram of a sub-pixel array including the repeating unit shown in (1a) of FIG. 1.

FIG. 2 is a schematic diagram of a sub-pixel array including the repeating unit shown in (1a) of FIG. 1. As shown in FIG. 2, four repeating units 1 are shown in FIG. 2 by way of example, and the sub-pixel array may be a sub-pixel array used for virtual display. A ratio of a width in a horizontal direction to a length in a vertical direction of each sub-pixel in the sub-pixel array may be larger than 1:3 (a ratio of a width in a horizontal direction to a length in a vertical direction of a conventional sub-pixel is 1:3), and such a sub-pixel can significantly reduce fabrication process difficulty in the horizontal direction, decrease channel number of data lines required in an integrated circuit of the display panel, and effectively lower production costs; in the meanwhile, since color resistors of a same color are separated from each other, the degree of color dispersion is increased, which allows an image of solid color to be displayed more uniformly.

Figure 3:
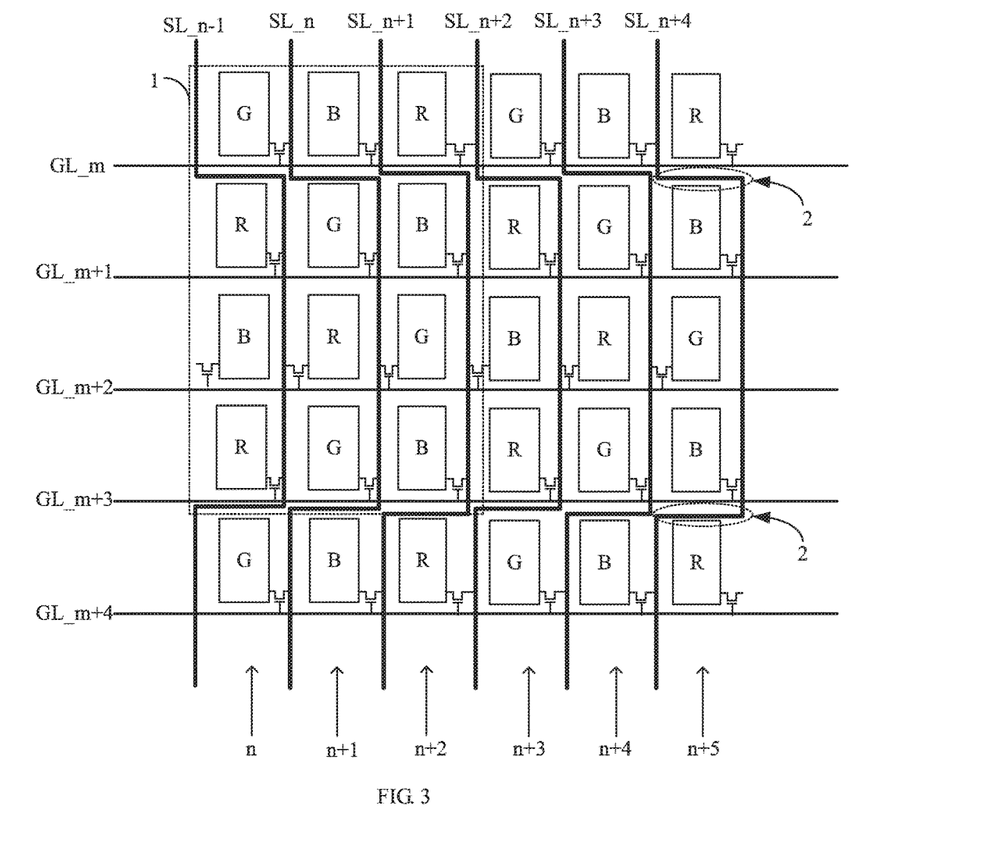
FIG. 3 is a schematic structure diagram of an array substrate provided in an embodiment of the present invention.

FIG. 3 is a schematic structure diagram of an array substrate provided in an embodiment of the present invention, in which it is assumed that the sub-pixel array on the array substrate is the sub-pixel array shown in FIG. 2, that is, the repeating unit in the sub-pixel array is the repeating unit shown in (1a) of FIG. 1. As shown in FIG. 3, each data line is connected to sub-pixels of a same color in corresponding three consecutive columns of sub-pixels. Specifically, the n-th data line SL_n on the array substrate is correspondingly connected to green sub-pixels G in the n-th to (n+2)-th columns in the sub-pixel array, the (n+1)-th data line SL_n+1 is correspondingly connected to blue sub-pixels B in the (n+1)-th to (n+3)-th columns in the sub-pixel array, the (n+2)-th data line SL_n+2 is correspondingly connected to red sub-pixels R in the (n+2)-th to (n+4)-th columns in the sub-pixel array, the (n+3)-th data line SL_n+3 is correspondingly connected to green sub-pixels G in the (n+3)-th to (n+5)-th columns in the sub-pixel array, . . . , and so on.

When the data line is connected to sub-pixels of a certain color in corresponding three consecutive columns of sub-pixels, optionally, each data line goes across a middle column of sub-pixels in the corresponding three consecutive columns of sub-pixels. In the embodiment, since one data line corresponds to three consecutive columns of sub-pixels, it is inevitable for the data line to go across at least one column of sub-pixels to be connected to sub-pixels of a same color in the corresponding three consecutive columns of sub-pixels. However, when the data line goes across one or more columns of sub-pixels, the data line must have a horizontal extending part 2 which is parallel to the gate lines and is close to a corresponding gate line, and in this case, crosstalk is likely to occur between the horizontal extending part 2 and the gate line, which in turn influences signal transmission in data lines and gate lines. In the embodiments of the present invention, each data line only goes across a middle column of sub-pixels in the corresponding three consecutive columns of sub-pixels, so that length of the horizontal extending part 2 in the data line is made as short as possible, and thus, crosstalk between the data lines and the gate lines can be effectively reduced on the premise that one data line is connected to sub-pixels of a same color in the corresponding three consecutive columns of sub-pixels.

In addition, in connection mode between the data lines and the sub-pixels shown in FIG. 3, two sub-pixels which are connected to a same data line and adjacent in the column direction are also adjacent in the row direction. Further, all data lines on the array substrate may be arranged parallel to each other.

It should be noted that the case where two sub-pixels which are connected to a same data line and adjacent in the column direction are also adjacent in the row direction in FIG. 3 is illustrative. In the embodiment, the data line may be connected to sub-pixels of a same color in the corresponding three consecutive columns of sub-pixels in other mode.

Figure 4:
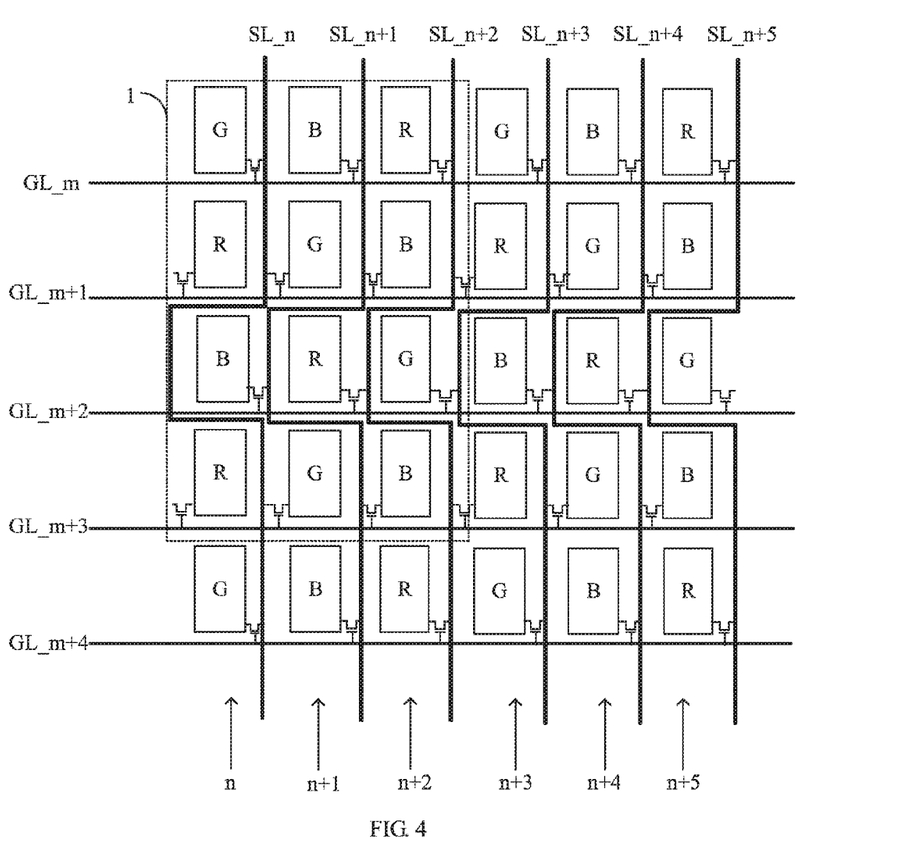
FIG. 4 is another schematic structure diagram of an array substrate provided in an embodiment of the present invention.

FIG. 4 is another schematic structure diagram of an array substrate provided in an embodiment of the present invention, in which the sub-pixel array on the array substrate is also the sub-pixel array shown in FIG. 2, that is, the repeating unit in the sub-pixel array is the repeating unit shown in (1a) of FIG. 1. As shown in FIG. 4, the n-th data line SL_n on the array substrate is correspondingly connected to green sub-pixels G in the (n−1)-th to (n+1)-th columns in the sub-pixel array, the (n+1)-th data line SL_n+1 is correspondingly connected to blue sub-pixels B in the n-th to (n+2)-th columns in the sub-pixel array, the (n+2)-th data line SL_n+2 is correspondingly connected to red sub-pixels R in the (n+1)-th to (n+3)-th columns in the sub-pixel array, the (n+3)-th data line SL_n+3 is correspondingly connected to green sub-pixels G in the (n+2)-th to (n+4)-th columns in the sub-pixel array, . . . , and so on. It can be shown from FIG. 4 that two sub-pixels which are connected to a same data line and adjacent in the column direction may not be adjacent in the row direction.

It should be noted that, in the embodiment, other connection modes in which one data line is connected to sub-pixels of a same color in corresponding three consecutive columns of sub-pixels are not listed one by one herein.

Figure 5:
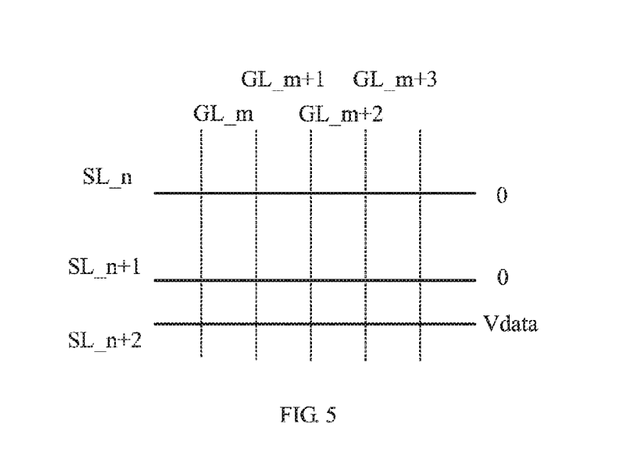
FIG. 5 is a schematic diagram of waveforms of signals on data lines when the array substrate shown in FIG. 3 displays an image of pure red.

The principle that the array substrate provided in the embodiments of the present invention has reduced power consumption in display of an image of pure color as compared with the prior art will be described in detail below in conjunction with the accompanying drawings by taking the case that the array substrate shown in FIG. 3 displays an image of pure red as an example. FIG. 5 is a schematic diagram of waveforms of signals on data lines when the array substrate shown in FIG. 3 displays an image of pure red. As shown in FIG. 5, to simplify explanation, the n-th, (n+1)-th and (n+2)-th data lines are taken as examples. To ensure that red sub-pixels R emit light while green sub-pixels G and blue sub-pixels B do not emit light, when the m-th gate line GL_m is scanned, the n-th data line SL_n outputs a reference voltage (e.g., a voltage the same as a common voltage, denoted as 0V) which causes the green sub-pixels G connected to the n-th data line SL_n not to emit light, the (n+1)-th data line SL_n+1 outputs the reference voltage which causes the blue sub-pixels B connected to the (n+1)-th data line SL_n+1 not to emit light, and the (n+2)-th data line SL_n+2 outputs a data voltage Vdata which allows the red sub-pixels R connected to the (n+2)-th data line SL_n+2 to emit light; when the (m+1)-th gate line GL_m+1 is scanned, the n-th data line SL_n keeps outputting the reference voltage, the (n+1)-th data line SL_n+1 keeps outputting the reference voltage, the (n+2)-th data line SL_n+2 outputs the data voltage Vdata; . . . ; and so on. When the last gate line on the array substrate is scanned, the n-th data line SL_n still outputs the reference voltage, the (n+1)-th data line SL_n+1 still outputs the reference voltage, and the (n+2)-th data line SL_n+2 still outputs the data voltage Vdata. It can be seen that waveforms of signals on the data lines are all DC (direct current) signal waveforms, and as compared with the case where pulse waveform signals are adopted to display an image of pure color in the prior art, the array substrate provided in the present embodiment can reduce power consumption of display effectively.

The array substrate provided in the present embodiment can not only reduce power consumption effectively, but also increase charging time of the sub-pixels when displaying a mixed-color image of a certain gray-scale, thus ensuing normal display of sub-pixels.

Detailed description will be given below in conjunction with the accompanying drawings by taking the case where the array substrate shown in FIG. 3 displays an image of mixed colors RGB (0, 127, 255) as an example. Herein, the image of mixed colors RGB (0, 127, 255) means that, in the array substrate, brightness levels of all red sub-pixels R are 0, brightness levels of all green sub-pixels G are 127, and brightness levels of all blue sub-pixels B are 255, and in this case, the display panel including the array substrate presents a mixed-color image of a certain gray-scale.

Figure 6:
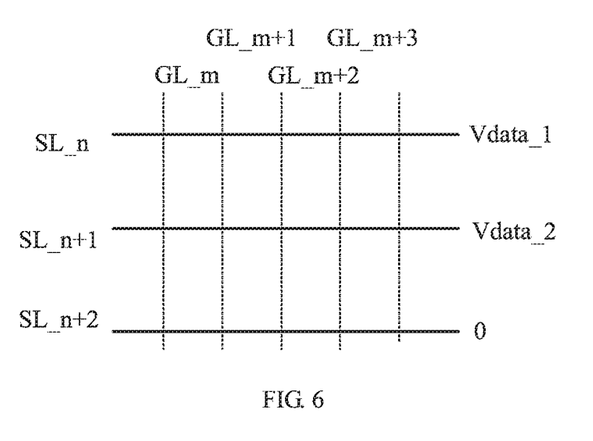
FIG. 6 is a schematic diagram of waveforms of signals on data lines when the array substrate shown in FIG. 3 displays an image of mixed colors RGB (0, 127, 255).

FIG. 6 is a schematic diagram of waveforms of signals on data lines when the array substrate shown in FIG. 3 displays an image of mixed colors RGB (0, 127, 255). As shown in FIG. 6, to simplify explanation, the n-th, (n+1)-th and (n+2)-th data lines are taken as examples. To ensure that red sub-pixels R do not emit light, green sub-pixels G emit light with brightness level of 127, and blue sub-pixels B emit light with brightness level of 255, when the m-th gate line GL_m is scanned, the n-th data line SL_n outputs a first data voltage Vdata_1 which allows the green sub-pixels G connected to the n-th data line SL_n to emit light with brightness level of 127, the (n+1)-th data line SL_n+1 outputs a second data voltage Vdata_2 which allows the blue sub-pixels B connected to the (n+1)-th data line SL_n+1 to emit light with brightness level of 255, the (n+2)-th data line SL_n+2 outputs the reference voltage which causes the red sub-pixels R connected to the (n+2)-th data line SL_n+2 not to emit light; when the (m+1)-th gate line GL_m+1 is scanned, the n-th data line SL_n keeps outputting the first data voltage Vdata_1, the (n+1)-th data line SL_n+1 keeps outputting the second data voltage Vdata_2, the (n+2)-th data line SL_n+2 keeps outputting the reference voltage; . . . ; and so on. When the last gate line on the array substrate is scanned, the n-th data line SL_n still outputs the first data voltage Vdata_1, the (n+1)-th data line SL_n+1 still outputs the second data voltage Vdata_2, and the (n+2)-th data line SL_n+2 still outputs the reference voltage. It can be seen that waveforms of signals on the data lines are all DC signal waveforms.

In the prior art, however, signals in data lines are pulse waveform signals, and a low voltage level (corresponding to the reference voltage) is switched into a high voltage level (corresponding to the data voltage) only at a certain charging timing; because there is always a certain time delay when the signals in the data lines are switched between a high voltage level and a low voltage level, and particularly, signal delay becomes large when the voltage difference between the high voltage level and the low voltage level is large, the time for the data lines to charge the sub-pixels becomes short accordingly and there is a risk of insufficient charge for sub-pixels. Compared with the prior art, since in the present application, the signals in all of the data lines are DC signals, there is no need for the signals in the data lines to switch between a high voltage level and a low voltage level, charging time for the sub-pixels is prolonged accordingly, and the risk of insufficient charge is greatly decreased.

It should be noted that, the array substrate provided in the embodiments of the present invention may be used for virtual display. Here, each sub-pixel on the array substrate may be in the shape of a rectangle with a width-length ratio ranging from 1:3~1:1 (e.g., 1:2, 1:1.5, or the like). In the prior art, one pixel includes three sub-pixels, and generally, each sub-pixel has a width a in the horizontal direction and a length 3a in the vertical direction. In the embodiments of the present invention, in order to reduce the number of data lines on the array substrate, the width in the horizontal direction and the length in the vertical direction of each sub-pixel in the embodiments of the present invention may be designed to be 2a and 3a, respectively, so that an area physically occupied by one sub-pixel in the embodiments of the present invention is equal to that physically occupied by two conventional sub-pixels; it may also be possible to design the width in the horizontal direction and the length in the vertical direction of each sub-pixel in the embodiments of the present invention to be 1.5a and 3a, respectively, so that an area physically occupied by two sub-pixels in the embodiments of the present invention is equal to that physically occupied by three conventional sub-pixels; or, the width in the horizontal direction and the length in the vertical direction of each sub-pixel in the embodiments of the present invention are designed to be 3a and 3a, respectively, so that an area physically occupied by one sub-pixel in the embodiments of the present invention is equal to that physically occupied by three conventional sub-pixels. Virtual display of a display panel can be realized based on the sub-pixels with the above structures and in conjunction with a corresponding virtual display driving method.

Embodiments of the present invention further provide a display panel including the array substrate described in the above embodiments. The specific structure of the array substrate may refer to the description in the above embodiments, and will not be described in detail herein.

Embodiments of the present invention further provide a display apparatus including the display panel described in the above embodiments. The display panel may be a liquid crystal panel or an OLED panel, and the display apparatus may be any product or component with a display function, such as an electronic paper, a mobile phone, a tablet computer, a television, a display, a notebook computer, a digital photo frame, a navigator or the like.

It can be understood that, the above implementations are merely exemplary implementations used for explaining the principle of the present invention, but the present invention is not limited thereto. For those skilled in the art, various modifications and improvements may be made without departing from the spirit and essence of the present invention, and these modifications and improvements are also deemed as falling within the protection scope of the present invention.

The invention claimed is:

1. An array substrate, comprising: a plurality of gate lines and a plurality of data lines, the plurality of gate lines and the plurality of data lines defining a sub-pixel array, wherein, the sub-pixel array contains sub-pixels of three different colors, the sub-pixel array comprises a plurality of repeating units, each of which comprises twelve sub-pixels arranged in a matrix of four rows and three columns;

in each repeating unit, three sub-pixels in a same row or a same column, among nine sub-pixels in three consecutive rows, have colors different from each other;

three sub-pixels in the other row than the three consecutive rows of the repeating unit are arranged in the same order as three sub-pixels in a middle row among the three consecutive rows;

each gate line is connected to a corresponding row of sub-pixels in the sub-pixel array; and each data line is connected to sub-pixels of a same color in corresponding three consecutive columns of sub-pixels in the sub-pixel array.

2. The array substrate according to claim 1, wherein, each data line goes across a middle column of sub-pixels in the corresponding three consecutive columns of sub-pixels.

3. The array substrate according to claim 1, wherein, two sub-pixels connected to a same data line and adjacent in a column direction are also adjacent in a row direction.

4. The array substrate according to claim 1, wherein, the data lines on the array substrate are all arranged parallel to each other.

5. The array substrate according to claim 1, wherein, the sub-pixels are in the shape of a rectangle.

6. The array substrate according to claim 4, wherein, the sub-pixels have a width-length ratio ranging from 1:3~1:1.

7. The array substrate according to claim 6, wherein, the sub-pixels have a width-length ratio of 1:2 or 1:1.5.

8. The array substrate according to claim 1, wherein, the sub-pixels of three different colors comprise red sub-pixels, green sub-pixels and blue sub-pixels.

9. The array substrate according to claim 1, wherein, the sub-pixel array is a sub-pixel array used for virtual display.

10. A display panel, comprising the array substrate according to claim 1.

11. The display panel according to claim 10, wherein, each data line goes across a middle column of sub-pixels in the corresponding three consecutive columns of sub-pixels.

12. The display panel according to claim 10, wherein, two sub-pixels connected to a same data line and adjacent in a column direction are also adjacent in a row direction.

13. The display panel according to claim 10, wherein, the data lines on the array substrate are all arranged parallel to each other.

14. The display panel according to claim 10, wherein, the sub-pixels are in the shape of a rectangle.

15. The display panel according to claim 14, wherein, the sub-pixels have a width-length ratio ranging from 1:3~1:1.

16. The display panel according to claim 15, wherein, the sub-pixels have a width-length ratio of 1:2 or 1:1.5.

17. The display panel according to claim 10, wherein, the sub-pixels of three different colors comprise red sub-pixels, green sub-pixels and blue sub-pixels.

18. The display panel according to claim 10, wherein, the sub-pixel array is a sub-pixel array used for virtual display.

19. A display apparatus, comprising the display panel according to claim 10.

* * * * *